United States Patent [19]
Lin et al.

[11] Patent Number: 5,290,992
[45] Date of Patent: Mar. 1, 1994

[54] APPARATUS FOR MAXIMIZING LIGHT BEAM UTILIZATION

[75] Inventors: How T. Lin, Vestal; Mark V. Pierson, Binghamton, both of N.Y.

[73] Assignee: International Business Machines Corporation, Armonk, N.Y.

[21] Appl. No.: 957,969

[22] Filed: Oct. 7, 1992

[51] Int. Cl.$^5$ ............................................. B23K 26/06
[52] U.S. Cl. ............................ 219/121.74; 219/121.68
[58] Field of Search ....................... 219/121.68, 121.69, 219/121.74

[56] References Cited

U.S. PATENT DOCUMENTS

| | | | |
|---|---|---|---|
| 2,792,740 | 5/1957 | Haynes | 88/1 |
| 4,230,408 | 10/1980 | Nigg | 355/35 |
| 4,653,903 | 3/1987 | Torigoe et al. | 355/53 |
| 4,661,679 | 4/1987 | Pardee | 219/121.74 |
| 5,223,693 | 6/1993 | Zumoto et al. | 219/121.68 |

*Primary Examiner*—C. L. Albritton
*Attorney, Agent, or Firm*—John D. Flynn

[57] ABSTRACT

The present invention is an apparatus and method for maximizing light beam utilization in patterning applications by positioning a plurality of mask mirrors in the light beam path to form patterned light onto a plurality of work pieces. Each mask mirror is designed so that a portion of the light beam area needed for exposing a work piece to patterned light is reflected from the mask mirror, while the remainder is passed through the mask mirror to another mask mirror. Alternatively, each mask mirror can be designed so that a portion of the light beam area needed for exposing a work piece to patterned light is passed through the mask mirror, while the remainder is reflected to another mask mirror.

21 Claims, 7 Drawing Sheets

APPARATUS FOR MAXIMIZING LIGHT BEAM UTILIZATION

FIELD OF THE INVENTION

This invention relates generally to the shining of light through a mask for forming patterned light on a work piece and specifically to an apparatus for producing light patterns on multiple work pieces using a single light beam.

BACKGROUND OF THE INVENTION

One objective of patterning applications is to form a desired light pattern on a work piece. The work piece is thus exposed to patterned light. Patterned light can be used in many diverse applications. Light patterning is used for the cutting and drilling of materials as well as lithographic applications such as mask generation, wafer exposure and panel exposure to mention just a few.

In most patterning applications, a light beam is directed through a mask toward a work piece. Typically, the mask contains areas that are transparent and other areas that are opaque to the light beam. Thus, portions of a light beam impinging on the mask pass through the transparent areas of the mask onto a work piece. The transparent areas can be arranged on the mask so as to form a desired pattern. Light light passing through the transparent areas on the mask impinges on a work piece to expose areas thereon to the light in a pattern corresponding to the transparent areas of the mask.

A disadvantage of this method is that most of the light energy is absorbed or reflected by the mask and thus wasted. An additional disadvantage is the low productivity. Only one work piece per light source can be processed at a time.

It is therefore an object of this invention to increase light beam utilization in patterning applications by a significant amount beyond that of the prior art.

It is a further object of this invention to increase the number of work pieces concurrently exposed to patterned light from a single light source.

It is another object of this invention to provide for the low cost utilization of the light beam to expose multiple work pieces to patterned light.

SUMMARY OF THE INVENTION

The foregoing and other objects of the invention are accomplished by positioning a plurality of mask mirrors along a light beam path. In one embodiment, each of the mask mirrors has at least one reflective region and at least one transparent region. When a light beam impinges on a mask mirror, a portion of the light beam is reflected from the reflective region or regions of the mask mirror towards an associated patterning defining mask.

The mask mirrors are each designed so that different portions of the light beam are reflected from each mask mirror. Thus, each mask mirror intercepts, by reflection, different portions of the light beam. The portions of the light beam required for patterning are reflected from each mask mirror towards each mask mirror's associated pattern defining mask. The mask mirrors are each positioned, with respect to other mask mirrors, so that the non-reflected portion of the light beam is transmitted so as to impinge on another mask mirror.

Alternatively, the mask mirrors can be designed so that different portions of the light beam are transmitted through each mask mirror. Thus, each mask mirror intercepts, by transmission, different portions of the light beam. In this embodiment the mask mirrors are each positioned, with respect to other mask mirrors, so that the reflected portion of the light beam impinges on another mask mirror. Thus, the transmitted portion is used for patterning.

Other objects, features and advantages of the invention will become apparent when reading the specification, taken in conjunction with the drawings.

DETAILED DESCRIPTION OF THE INVENTION

Figure 1:
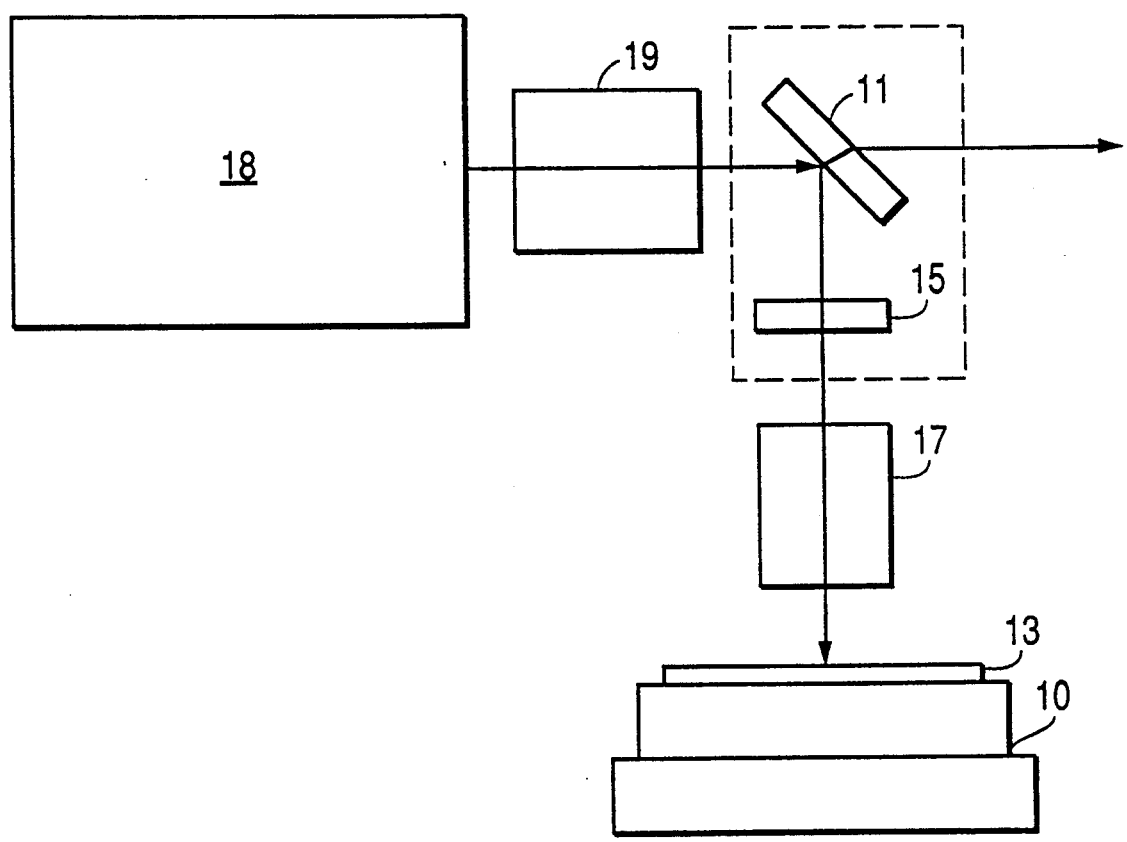
FIG. 1 schematically illustrates a portion of a multiple work piece exposure system of the present invention for utilizing the reflected portion of the light beam to expose a single work piece.

As shown in FIG. 1, the present invention includes a light source (18) such as for example, an excimer laser for providing a light beam. The present invention is not limited to use with an excimer laser and other types of lasers and light sources may be utilized. Beam forming optics or a beam homogenizer (19) may also be included to homogenize and/or shape the light into the desired light beam. Best results are obtained when the beam is of uniform intensity. Although the present embodiment is illustrated with a rectangular beam shape, the present invention is not limited to any particular beam shape.

A mask mirror (11) is positioned in the light beam path as shown in FIG. 1. The mask mirror (11) has one or more reflective regions located within a transparent region. The mask mirror (11) is positioned such that portions of the light beam impinging on the mask mirror are reflected from the reflective regions. The reflected portions of the light beam impinge on the associated pattern defining mask (15) and are then utilized for exposing a work piece (13) to patterned light. The remaining portion of the light beam, i.e., the portion not reflected from the reflective regions of the mask mirror (11), passes through the transparent region of the mask mirror (11) impinging on other mask mirrors (not shown).

The pattern defining mask (15) forms a desired pattern of light by absorbing or reflecting part of the light beam impinging on it. The portion of the impinging light beam not absorbed or reflected passes through the pattern defining mask and through the miscellaneous optics (17). The miscellaneous optics (17) may be included to improve the quality of the beam pattern formed onto the work piece (13) or to magnify, focus, scale, translate and/or steer the light pattern formed by the pattern defining mask (15).

Figure 2:
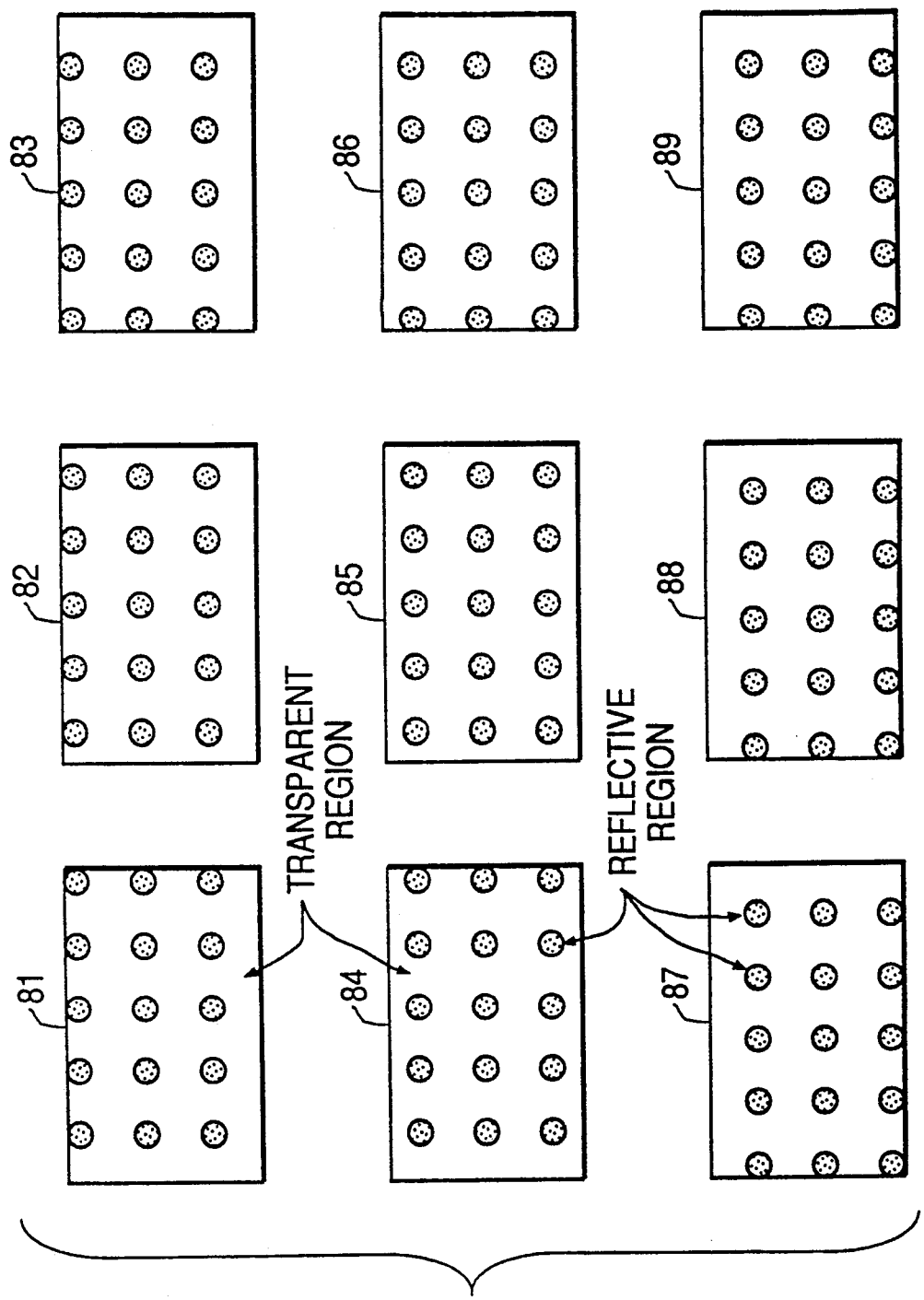
FIG. 2 illustrates a plurality of mask mirrors for reflecting different portions of a light beam towards respective pattern defining masks, each mask mirror contains a plurality of circular reflective regions positioned within a transparent region.

FIG. 2 shows an example of a plurality of mask mirrors each with a plurality of circular reflective regions located within a transparent region. Note that the circular reflective regions are offset for each of the mask mirrors so that each mask mirror can reflect different portions of the light beam. As shown, the reflective regions of mask mirror (82) are skewed slightly to the right of the reflective regions of mask mirror (81). Likewise the reflective regions of mask mirror (83) are skewed slightly to the right of the reflective regions of mask mirror (82). The different relative orientation of reflective regions from mask mirror to mask mirror assures that each mask mirror in the plurality intercepts or reflects a different portion of the light beam.

Although FIG. 2 shows a plurality of mask mirrors each with a plurality of circular reflective regions, other shaped reflective regions can also be utilized by the invention. In fact, the invention can be carried out with a single reflective region on each mask mirror. The shape, size and number of the reflective regions on each of the mask mirrors may also vary. Thus, for example, one mask mirror in the plurality may have one circular reflective region while another mask mirror may have ten square shaped reflective regions.

Also note that FIG. 2 shows mask mirrors with a rectangular shape. However, mask mirrors of any shape may be utilized with the present invention. Best results are achieved when the size and shape of the mask mirror completely encompass the light beam.

Figure 3:
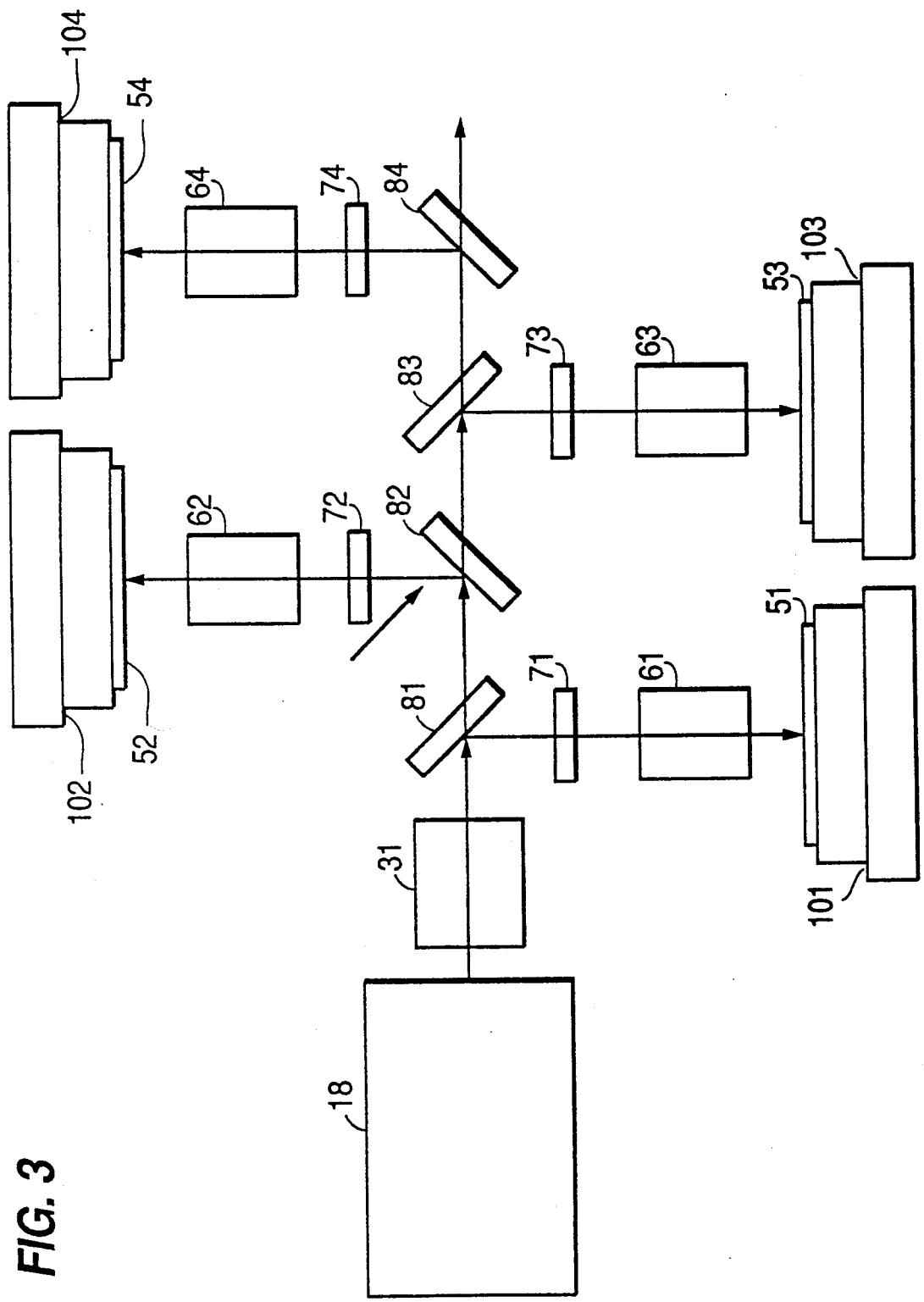
FIG. 3 schematically illustrates a portion of a multiple work piece exposure system of the present invention.

FIG. 3 illustrates one embodiment of the invention with multiple mask mirrors (81,82,83,84) and associated pattern defining masks (71,72,73,74) that utilizes a single light beam to ablate or drill multiple panels (51,52,53,54) concurrently. The panels (51,52,53,54) to be ablated may be disposed on an X-Y stage or multiple X-Y stages (101,102,103,104).

A laser (18) generates light that is formed into a light beam by beam forming optics (31). The resulting light beam impinges on the first mask mirror (81). A portion of the light beam is reflected from the reflective regions of the mask mirror (81). The reflected portion consists of fifteen roughly circular shaped beams that correspond to the fifteen reflective regions of mask mirror (81) shown in FIG. 2.

The reflected portion, from the first mask mirror (81), impinges on the first hole defining mask (71). The hole defining mask (71) shapes the roughly shaped beams into well defined beams by absorbing or reflecting undesired or unneeded portions of these beams. The well defined beams then travel through a set of miscellaneous optics (61) where the beams are magnified, focused, scaled, translated and/or steered onto the work piece (51) on the X-Y stage (101).

The portion of the light beam impinging on the first mask mirror (81) that is not reflected passes through the transparent region of first mask mirror (81), impinging on the second mask mirror (82). A portion of the light beam impinging on the second mask mirror (82) is reflected from the reflective regions of the second mask mirror (82). The reflected portion impinges on the second hole defining mask (72). This reflected portion consists of roughly shaped circular beams which are shaped into well defined beams by the second hole defining mask (72). The well defined beams then travel through a second set of miscellaneous optics (62) where the beams are magnified, focused, scaled, translated and/or steered onto the work piece (52) on the X-Y stage (102).

The portion of the light beam impinging on the second mask mirror (82) that is not reflected passes through the transparent region of the second mask mirror (82), impinging on the third mask mirror (83). A portion of the light beam impinging on the third mask mirror (83) is reflected from the reflective regions of the third mask mirror (83). The reflected portion impinges on the third hole defining mask (73). This reflected portion consists of roughly shaped circular beams which are shaped into well defined beams by the third hole defining mask (73). The well defined beams then travel through a third set of miscellaneous optics (63) where the beams are magnified, focused, scaled, translated and/or steered onto the work piece (53) on the X-Y stage (103).

The portion of the light beam impinging on the third mask mirror (83) that is not reflected thereby passes through the transparent region of the third mask mirror (83), impinging on the fourth mask mirror (84). A portion of the light beam impinging on the fourth mask mirror (84) is reflected from the reflective regions of the fourth mask mirror (84). The reflected portion impinges on the fourth hole defining mask (74). This reflected portion consists of roughly shaped circular beams which are shaped into well defined beams by the fourth hole defining mask (74). The well defined beams then travel through a fourth set of miscellaneous optics (64) where the beams are magnified, focused, scaled translated and/or steered onto the work piece (54) on the X-Y stage (104).

Although not shown in FIG. 3, utilization of the light beam continues at successive mask mirrors using the portion of the light beam that passes through the preceding mask mirrors. Each mask mirror reflects different portions of the light beam with its reflective regions. Additional mask mirrors can be added until the light beam transmitted is no longer suitable for use.

Figure 4:
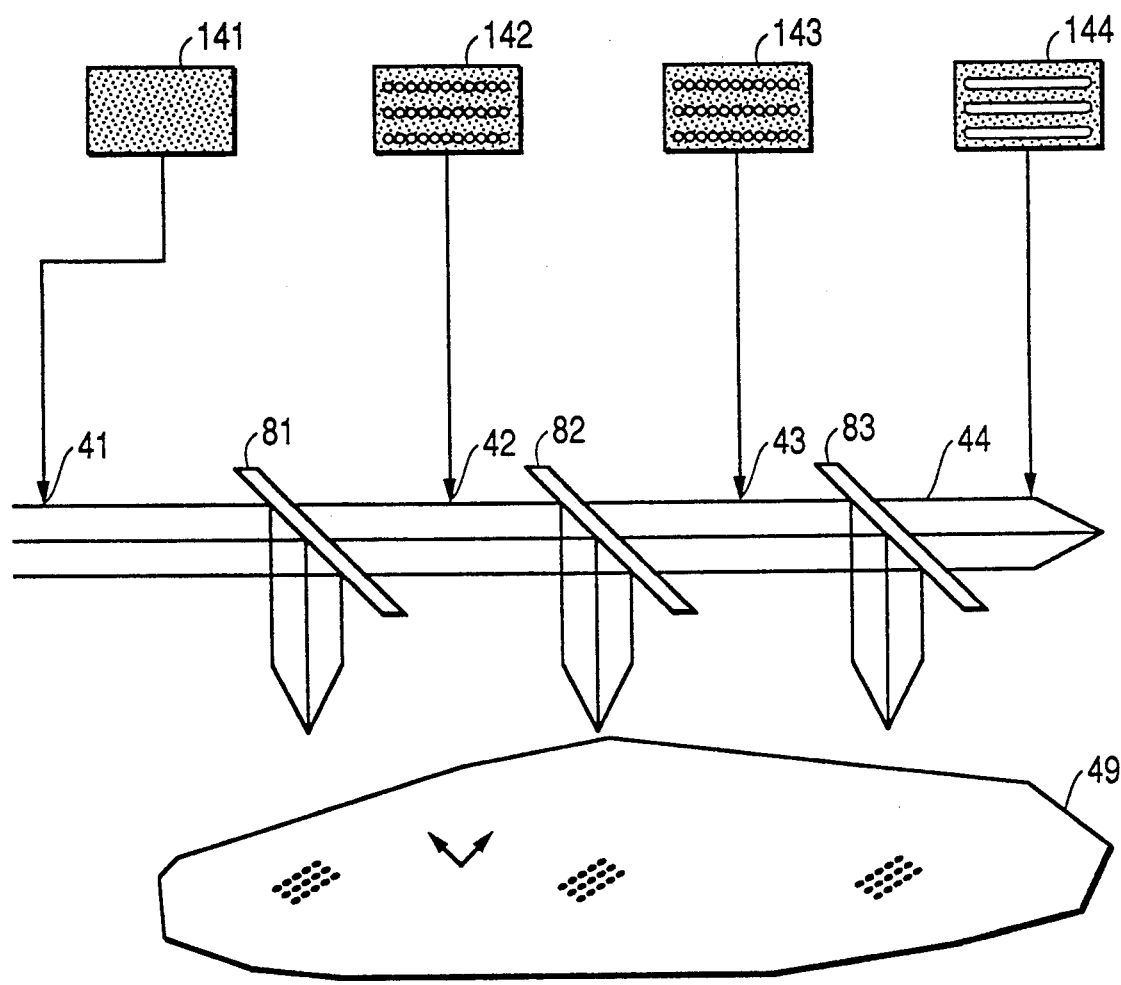
FIG. 4 illustrates the cross section of the light beam as it passes through several mask mirrors.

FIG. 4 further illustrates operation of several of the mask mirrors shown in FIG. 2. The rectangular shaped raw beam (41), whose cross section (141) is shown, impinges on mask mirror (81). Mask mirror (81) with its fifteen circular reflective regions reflects a portion of the raw beam consisting of fifteen roughly circular beams. These roughly circular beams are shown impinging on the traveling table (49). The remaining portion of the raw beam, labeled the first transmitted beam (42), is transmitted through the transparent region of mask mirror (81) impinging on mask mirror (82). A cross section (142) of the first transmitted beam (42) is shown in FIG. 4.

Mask mirror (82) is similar to the mask mirror (81) except that the fifteen circular reflective regions of mask mirror (82) are offset from those of mask mirror (81). As the first transmitted beam (42) impinges on mask mirror (82), mask mirror (82) with its fifteen circular reflective regions causes fifteen roughly circular beams to be reflected. These roughly circular beams are shown impinging on the traveling table (49). The remaining portion of the light beam, labeled the second transmitted beam (43), is transmitted through the transparent region of mask mirror (82) impinging on mask mirror (83). The second transmitted beam (43) consists of the raw beam (41) minus the fifteen roughly circular beams reflected from mask mirror (81), minus the fifteen roughly circular beams reflected from mask mirror (82). A cross section (143) of the second transmitted beam (43) is shown in FIG. 4.

Mask mirror (83) is similar to mask mirror (81) and mask mirror (82) except that the fifteen circular reflective regions of mask mirror (83) are offset from those of mask mirror (81) and mask mirror (82). As the second transmitted beam (43) impinges on mask mirror (83), mask mirror (83) with its fifteen circular reflective regions causes fifteen roughly circular beams to be reflected. These roughly circular beams are shown impinging on the traveling table (49). The remaining portion of the light beam, labeled the third transmitted beam (44), is transmitted through the transparent region of mask mirror (83) toward the next mask mirror (not shown). The third transmitted beam (44) consists of the raw beam (41) minus the fifteen roughly circular beams reflected from mask mirror (81), minus the fifteen roughly circular beams of mask mirror (82), minus the fifteen roughly circular beams of mask mirror (83). A cross section (144) of the third transmitted beam (44) is shown in FIG. 4.

Other mask mirrors can be added to reflect different portions of the impinging light beam toward the traveling table (49) and transmit the remaining light beam towards remaining mask mirrors. Although, FIG. 4 illustrates a laser with a rectangular beam and mask mirrors with circular reflective portions the present invention is not limited to any particular shapes. Thus, a triangular, circular, square, rectangular or any other shaped light beam could be used with any combination of circular, triangular, square, rectangular or any other shaped reflective regions on any shaped mask mirror.

Figure 5:
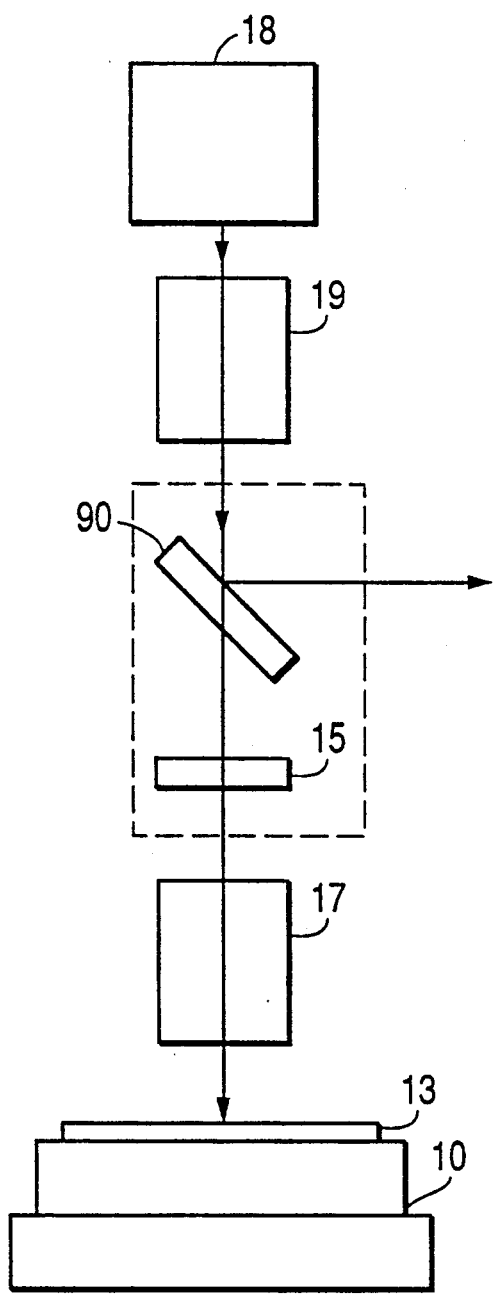
FIG. 5 schematically illustrates a portion of a multiple work piece exposure system of the present invention for utilizing the transmitted portion of the light beam to expose a single work piece.

An alternative embodiment of the invention is accomplished by reversing the reflective portions and the transmitted portion of the mask mirror. In this embodiment the transmitted portions of the beam are used for patterning and the reflected portion is directed to the next mask mirror for further energy removal. This embodiment is shown in FIG. 5, and includes a laser light source (18) for providing a light beam. Beam forming optics and/or a beam homogenizer (19) may also be included to homogenize and/or shape the light into the desired light beam.

A mask mirror (90) is positioned in the light beam path as shown in FIG. 5. The mask mirror (90) has one or more transparent regions located within a reflective region. The mask mirror (90) is positioned such that portions of the light beam impinging on the mask mirror are transmitted through the transparent regions. The transmitted portions of the light beam impinge on the associated pattern defining mask (15) and are then utilized for exposing a work piece (13) to patterned light. The remaining portion of the light beam is reflected from the reflective region of the mask mirror (90). The mask mirror (90) is positioned so that the reflected portion impinges on another mask mirror (not shown).

The pattern defining mask (15) and miscellaneous optics (17) serve the same function in this embodiment as in the embodiment previously described.

Figure 6:
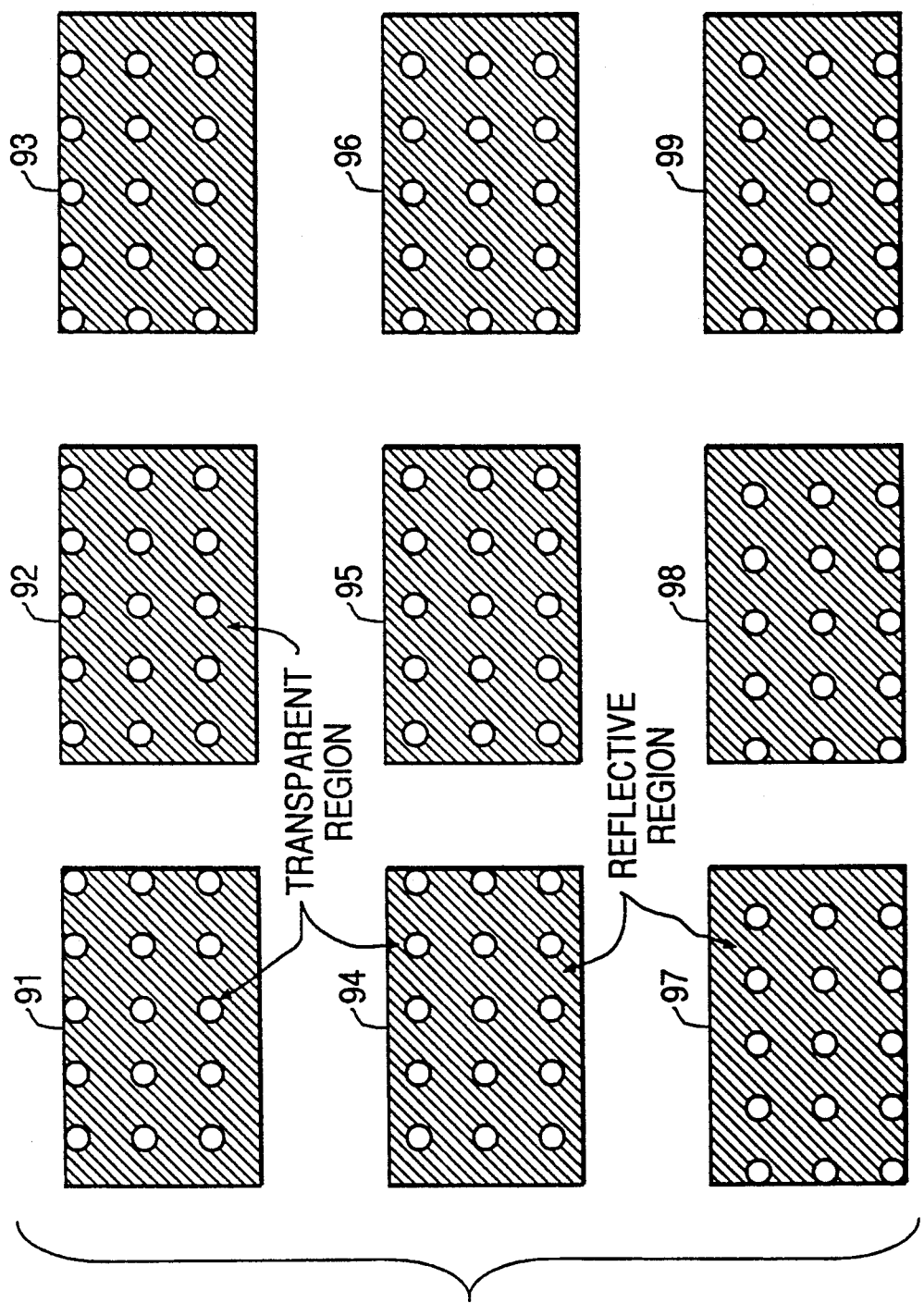
FIG. 6 illustrates a plurality of mask mirrors for transmitting different portions of a light beam towards respective pattern defining masks, each mask mirror contains a plurality of circular transparent regions positioned within a reflective region.

FIG. 6 shows an example of a plurality of mask mirrors each with a plurality of circular transparent regions located within a reflective region. Note that the circular transparent regions are offset for each of the mask mirrors so that each mask mirror can intercept different portions of the light beam. As shown, the transparent regions of mask mirror (92) are skewed slightly to the right of the transparent regions of mask mirror (91). Like wise the transparent regions of mask mirror (93) are skewed slightly to the right of the transparent regions of mask mirror (92). The different relative orientation of transparent regions from mask mirror to mask mirror assures that each mask mirror in the plurality intercepts a different portion of the light beam.

Although FIG. 6 shows a plurality of mask mirrors each with a plurality of circular transparent regions, other shaped transparent regions can also be utilized by the invention. In fact, the invention can be carried out with a single transparent region on each mask mirror. The shape, size and number of the transparent regions on each of the mask mirrors may also vary. Thus one mask mirror in the plurality may have one circular transparent region while another mask mirror may have ten square shaped transparent regions.

Also note that FIG. 6 shows mask mirrors with a rectangular shape. However, mask mirrors of any shape may be utilized with the present invention. Best results are achieved when the size and shape of the mask mirror completely encompass the light beam.

Figure 7:
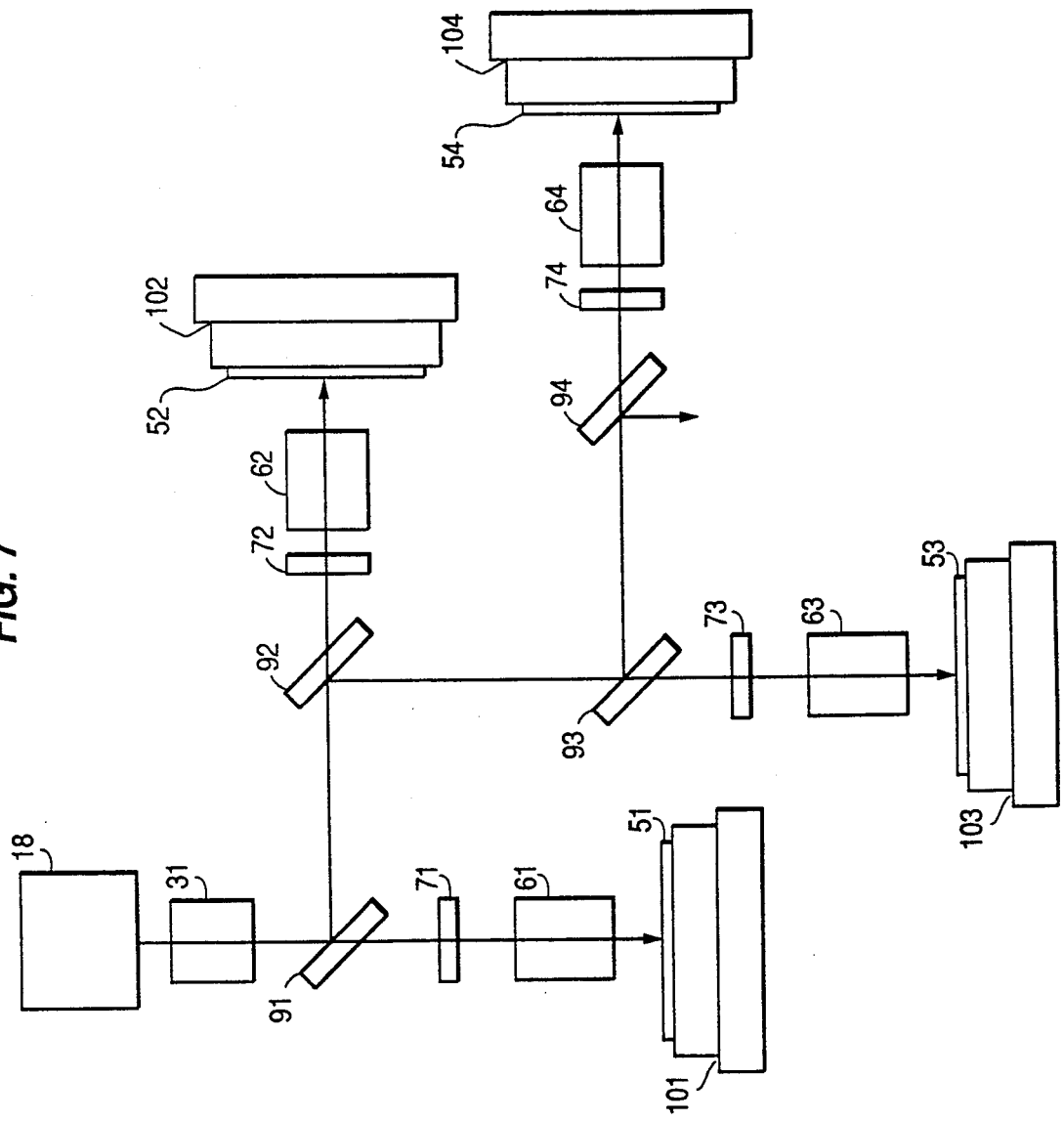
FIG. 7 schematically illustrates a portion of a multiple work piece exposure system of the present invention.

FIG. 7 illustrates another embodiment of the invention with multiple mask mirrors (91,92,93,94) and associated pattern defining masks (71,72,73,74) that utilizes a single light beam to ablate or drill multiple panels (51,52,53,54) concurrently. The panels (51,52,53,54) to be ablated may be situated on the same X-Y stage or multiple X-Y stages (101,102,103,104). A light source (18) generates light that is formed into a light beam by beam forming optics (31). The resulting light beam impinges on the first mask mirror (91). A patterning portion of the light beam passes through the transparent regions of the mask mirror (91). The patterning portion consists of fifteen roughly circular shaped beams that correspond to the fifteen transparent regions of mask mirror (91) shown in FIG. 6.

The patterning portion, from the first mask mirror (91), impinges on the first hole defining mask (71). The hole defining mask (71) shapes the roughly shaped beams into well defined beams by absorbing or reflecting undesired or unneeded portions of these beams. The well defined beams then travel through a set of miscellaneous optics (61) where the beams are magnified, focused, scaled, translated and/or steered onto the work piece (51) on the X-Y stage (101).

The portion of the light beam impinging on the first mask mirror (91) that is reflected from the reflective region of first mask mirror (91), impinges on the second mask mirror (92). A patterning portion of the light beam impinging on the second mask mirror (92) passes through the transparent regions of the second mask mirror (92). The patterning portion impinges on the second hole defining mask (72). This patterning portion consists of roughly shaped circular beams which are shaped into well defined beams by the second hole defining mask (72). The well defined beams then travel through a second set of miscellaneous optics (62) where the beams are magnified, focused, scaled, translated and/or steered onto the work piece (52) on the X-Y stage (102).

The portion of the light beam impinging on the second mask mirror (92) that is reflected from the reflective region of the second mask mirror (92), impinges on the third mask mirror (93). A patterning portion of the light beam impinging on the third mask mirror (93) passes through the transparent regions of the third mask mirror (93). The patterning portion impinges on the third hole defining mask (73). This patterning portion consists of roughly shaped circular beams which are shaped into well defined beams by the third hole defining mask (73). The well defined beams then travel through a third set of miscellaneous optics (63) where the beams are magnified, focused, scaled, translated or steered onto the work piece (53) on the X-Y stage (103).

The portion of the light beam impinging on the third mask mirror (93) that is reflected from the reflective region of the third mask mirror (93), impinges on the fourth mask mirror (94). A patterning portion of the light beam impinging on the fourth mask mirror (94) passes through the transparent regions of the fourth mask mirror (94). The patterning portion impinges on the fourth hole defining mask (74). This patterning portion consists of roughly shaped circular beams which are shaped into well defined beams by the fourth hole defining mask (74). The well defined beams then travel through a fourth set of miscellaneous optics (64) where the beams are magnified, focused, scaled, translated or steered onto the work piece (54) on the X-Y stage (104).

Although not shown in FIG. 7, utilization of the light beam continues at successive mask mirrors using the portion of the light beam that is reflected from the preceding mask mirrors. Each mask mirror captures different portions of the light beam with its transparent regions. Additional mask mirrors can be added until the reflected light beam is no longer suitable for use.

THE LIGHT SOURCE

The intensity and wavelength requirements of the light source depend on the patterning application and the material under process. For cutting and drilling applications, several watts to thousands of watts of light power are needed. Common lasers that can be used in this type of applications are shown in table I.

TABLE 1

Common Lasers for Drilling and Cutting Applications

| TYPE | WAVELENGTH | POWER | MANUFACTURERS (MODEL #) |
|---|---|---|---|
| CO2 | 10.6 um | 2-1000 Watts | PRC (1501), Synrad (57-G1) etc. |
| Solid State (e.g. ND:YAG, ND:YLF) | approx. 1047 nm-1535 nm | 1-1800 Watts | Lee Laser (712T), Quantronix (4216-1.3) |
| Diode | approx. 635 nm-1550 nm | 1-15 Watts | EG & G (SG3001A) Spectra Diode Lab (SDL2272-P1) |
| Excimer | 193 nm (ArF), 248 nm (KrF), 308 nm (XeCl), 351 nm (ArF) | 1-600 Watts | Lambda Physik (LAMBDA3000) Lumonics (EX602) |

For lithography applications such as mask generation, wafer and panel exposure a few milliwatts to several watts of power are needed. For this type of application, lasers with shorter wavelengths (less than or equal to 488 nm) are normally used. Common lasers used in these type of applications are shown in Table II.

TABLE II

Common Lasers for Lithography Applications

| TYPE | WAVELENGTH | POWER | MANUFACTURERS (MODEL #) |
|---|---|---|---|
| Ion (e.g. Argon, Krypton) | 333 nm-488 nm | 0.1-20 Watts | Coherent (INNOVA400-K3), Spectra-Physics (2040E) |
| Helium-Cadmium | 325 nm-442 nm | 0.01-0.15 Watts | Omichrome (4112-150M) LiCONiX (4270N) |
| Excimer | 193 nm (ArF), 248 nm (KrF), 308 nm (XeCl), 351 nm (ArF) | 1-600 Watts | Lambda Physik(LAMBDA3000) Lumonics (EX602) |

THE BEAM FORMING OPTICS

Beam forming optics can be used for shaping the beam to improve uniformity and/or beam divergence. The devices used are beam integrators, beam homogenizers, beam expanders and beam collimators. The design and usage of each of these devices are a function of the patterning application and the laser utilized. The beam expander and collimator are usually off-the-shelf devices. For example, Newport model# T28-100-XXX and model# T81-20X and Oriel model# 15281 model#15600. The beam integrators and beam homogenizers are most likely a custom built optical subsystem but, the design of such lens systems is well understood by those of ordinary skill in the lens design field.

THE MASK MIRRORS

The mask mirrors require a material with reflective characteristics for the reflective regions or region and good transmission characteristics in the transparent region or regions. Actual materials used are dependent on light beam wavelength and strength. A typical method of making the mask mirror is by coating a suitable substrate (e.g. quartz, glass, thin metal blanks etc) with a reflective material by using a standard sputtering or an evaporative process. Once the substrate is coated, part of the coating on the substrate will be removed by etching to allow for light transmission through the substrate in regions where the coating is removed. An alternative approach masks out transparent areas during the coating step. The masks are removed after coating, leaving the transparent regions.

A person of ordinary skill in the art could make such a mask using photolithography or other suitable techniques. The choice of coating and substrate material are a function of the light wavelength(s) and power. For example, gold can usually be used as the high reflective coating material for wavelengths above 700 nm. A mirror mask with chromium deposited on a glass substrate is suitable for use with most excimer type lasers. A dielectric coating material is usually used for ultraviolet (UV) (wavelength less than 400 nm) wavelengths. Most standard metal coating can be used for wavelengths in the visible light region.

For best results, the substrate material must exhibit extremely low absorption at the wavelength selected for the laser. For example, Quartz can be used for wavelengths ranging from 180 nm to 3000 nm. For longer wavelengths such as that from a Carbon Dioxide Laser (10.6 um), Zinc Selenide (ZnSe) is the best material. Other types of masks may also be used depending on the type of laser and the application. As a rule of thumb, a material with a high damage threshold should be selected for the coating and the substrate material.

PATTERN DEFINING MASK

The pattern defining mask forms the desired light pattern onto the work piece. It can be used to shape, reduce or pattern the light formed onto the work piece.

The pattern defining mask forms the desired pattern on the work piece by absorbing or reflecting part of the light beam impinging on the pattern defining mask. The portion of the impinging light beam not absorbed or reflected passes through the pattern defining mask. The resultant light forms the desired pattern onto the work piece or associated miscellaneous optics. It is the location, orientation, size and shape of the transparent regions of the pattern defining mask that define the light pattern formed on the work piece.

A simple example will be illustrated using the apparatus shown in FIG. 3. Suppose the fifteen roughly circular beams of light reflected from mask mirror (81) consist of beams each approximately 100 mils in diameter. The associated pattern defining mask (71) could block all or any subset of these beams. Alternatively, the pattern defining mask (71) could reduce the size of these beams to 50 mils or change the shape of the beams from circular to square, triangular or any other shape or pattern needed for the particular application.

The pattern defining mask can be manufactured using the same techniques as those described in producing the mask mirror. The criteria used for selecting materials for the mask mirror can also be used for choosing the substrate and coating materials for the pattern defining mask. In addition to the reflective coating, one can use a non-transparent material to cover the substrate on selected areas to prevent light transmission through the pattern defining mask. The non-transparent material must be carefully selected so that excessive heating does not occur.

Some applications require only a very simple pattern defining mask. For instance, if the purpose of the pattern defining mask is to reduce the size of each roughly circular light beam from 100 mils to 50 mils. A pattern defining mask could be made of any metal, reflective material or opaque material. As long as the pattern defining mask contained the required number of 50 mil holes each centered on one of the reflected roughly circular light beams. Other applications may require the pattern defining mask to be made by depositing a reflective or absorbing material onto a transparent substrate such as glass.

The pattern defining mask may have individually programmable shutters that are located relative to the patterning portion of the light beam from the mask mirror. The programmable shutters are particular useful in drilling applications where most work pieces do not require a hole to be drilled for each portion of the light beam reflected from the mask mirror. For example, suppose that not all work pieces require all fifteen beams reflected from the mask mirror as shown in FIG. 3. Programmable shutters could be utilized as a flexible means for selecting which, if any, of the fifteen beams to form on the work piece. The programmable shutters can be located between the mask mirror and the miscellaneous optics. The shutters can be miniature spring loaded pins that are actuated by an electric solenoid, which in turn is controlled by a high speed control system. The shutters can be made small to keep the actuation time low, and to physically fit in a relatively small space.

Also, a pattern defining mask can be attached to each respective work piece. An optical alignment of the mask to the part is needed to align the patterning defining mask with the work piece. After the alignment has occurred, pattern light can be formed on the work piece.

MISCELLANEOUS OPTICS

The miscellaneous optics receive the light pattern formed by the pattern defining mask. These miscellaneous optics may be included to improve the quality of the light pattern formed onto the work piece or to magnify, focus, scale, translate and/or steer the light pattern. The function of the miscellaneous optics are application dependent. The miscellaneous optics can provide any combination of functions needed such as magnifying, focusing, scaling, translating and steering the light pattern. These optical subsystems are usually specifically designed for a particular applications by an optics design house and such design is within the skill of ordinary lens designers.

While the present invention has been described with reference to specific embodiments, it will be understood by those skilled in the art that changes in form and detail may be made without departing from the spirit and scope of the invention. The embodiments presented are for purposes of example and illustration only and are not to be taken to limit the scope of the invention narrower than the scope of the appended claims.

What is claimed is:

1. An apparatus for exposing a plurality of work pieces to patterned light, comprising:
   a) a light source for generating a light beam;
   b) a plurality of mask mirrors, each mask mirror having at least one reflective region and at least one transparent region, each mask mirror is positioned so that a portion of said light beam is transmitted thereby and another portion of said light beam is reflected thereby, and
   c) a plurality of pattern defining masks, each pattern defining mask associated with a respective mask mirror, for receiving light from said associated mask mirror to form patterned light on a respective work piece.

2. An apparatus for exposing a plurality of work pieces to patterned light, comprising:
   a) a light source for generating a light beam;
   b) a plurality of mask mirrors, each mask mirror having one or more reflective regions located within a transparent region, said plurality of mask mirrors positioned so that the light beam impinging on the mask mirror is divided into a patterning portion that is reflected from said plurality of reflective regions and a transparent portion that passes through said transparent region toward the next mask mirror of the plurality of mask mirrors; and
   c) a plurality of pattern defining masks, each pattern defining mask associated with a respective mask mirror and positioned so that said patterning portion reflected from said reflective regions of said associated mask mirror impinges on said pattern defining mask so as to form patterned light onto a respective work piece.

3. The apparatus as defined in claim 2, wherein the light source includes beam forming optics for forming a light beam with light from said light source.

4. The apparatus as defined in claim 2 wherein the light source is a laser.

5. The apparatus as defined in claim 4, wherein the light source includes a beam homogenizer for forming a homogenized light beam with light from said light source.

6. The apparatus as defined in claim 5, further comprising a plurality of miscellaneous optics, each associated with a respective pattern defining mask for forming a light pattern onto a respective work piece.

7. The apparatus as defined in claim 5, further comprising a plurality of miscellaneous optics, each associated with a respective pattern defining mask for focusing the patterned light onto a respective work piece.

8. The apparatus as defined in claim 5, further comprising a plurality of miscellaneous optics, each associated with a respective pattern defining mask for scaling the patterned light onto a respective work piece.

9. The apparatus as defined in claim 5 wherein the plurality of pattern defining masks form an identical light pattern onto each respective work piece.

10. The apparatus as defined in claim 5 wherein each pattern defining mask has programmable shutters for forming a light pattern onto each respective work piece.

11. The apparatus as defined in claim 5 wherein each pattern defining mask is attached to the work piece for forming a light pattern onto each respective work piece.

12. An apparatus for exposing a plurality of work pieces to patterned light, comprising:
   a) a light source for generating a light beam;
   b) a plurality of mask mirrors, each mask mirror having one or more transparent regions located within a reflective region, said plurality of mask mirrors arranged so that a light beam impinging on the mask mirror is divided into a patterning portion that passes through said plurality of transparent regions and a reflected portion that is reflected from said reflective region toward the next mirror of the plurality; and
   c) a plurality of pattern defining masks, each pattern defining mask associated with a respective mask mirror and arranged so that said patterning portion of light passing through said transparent region of said associated mask mirror impinges on said pattern defining mask so as to form patterned light onto a respective work piece.

13. The apparatus as defined in claim 12, wherein the light source includes beam forming optics for forming a light beam with light from said light source.

14. The apparatus as defined in claim 12 wherein the light source is a laser.

15. The apparatus as defined in claim 14, wherein the light source includes a beam homogenizer for forming a homogenized light beam with light from said light source.

16. The apparatus as defined in claim 15, further comprising a plurality of miscellaneous optics, each associated with a respective pattern defining mask for forming a light pattern onto a respective work piece.

17. The apparatus as defined in claim 15, further comprising a plurality of miscellaneous optics, each associated with a respective pattern defining mask for focusing the patterned light onto a respective work piece.

18. The apparatus as defined in claim 15, further comprising a plurality of miscellaneous optics, each associated with a respective pattern defining mask for scaling the patterned light onto a respective work piece.

19. The apparatus as defined in claim 15 wherein the plurality of pattern defining masks form an identical light pattern onto each respective work piece.

20. The apparatus as defined in claim 15 wherein each pattern defining mask has programmable shutters for forming a light pattern onto each respective work piece.

21. The apparatus as defined in claim 15 wherein each pattern defining mask is attached to the work piece for forming a light pattern onto each respective work piece.

* * * * *